(12) United States Patent
Peidous

(10) Patent No.: US 9,640,666 B2
(45) Date of Patent: May 2, 2017

(54) INTEGRATED CIRCUIT EMPLOYING VARIABLE THICKNESS FILM

(75) Inventor: Igor Peidous, Fishkill, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 11/781,664

(22) Filed: Jul. 23, 2007

(65) Prior Publication Data

US 2009/0026545 A1   Jan. 29, 2009

(51) Int. Cl.
| | |
|---|---|
| *H01L 21/70* | (2006.01) |
| *H01L 29/786* | (2006.01) |
| *H01L 21/8238* | (2006.01) |
| *H01L 21/84* | (2006.01) |
| *H01L 27/12* | (2006.01) |
| *H01L 29/06* | (2006.01) |
| *H01L 29/66* | (2006.01) |
| *H01L 29/78* | (2006.01) |

(52) U.S. Cl.
CPC ............ *H01L 29/78603* (2013.01); *H01L 21/823807* (2013.01); *H01L 21/823878* (2013.01); *H01L 21/84* (2013.01); *H01L 27/1203* (2013.01); *H01L 29/0649* (2013.01); *H01L 29/66636* (2013.01); *H01L 29/7848* (2013.01); *H01L 29/78687* (2013.01); *H01L 29/78696* (2013.01)

(58) Field of Classification Search
CPC ..... H01L 21/823807; H01L 21/823878; H01L 21/84; H01L 27/1203; H01L 29/78696; H01L 29/66636; H01L 29/78603; H01L 29/78687; H01L 29/0649
USPC .... 257/244, 368, E21.46, E29.255; 438/151, 438/164
See application file for complete search history.

(56) References Cited

U.S. PATENT DOCUMENTS

| | | | |
|---|---|---|---|
| 5,116,771 A | 5/1992 | Karulkar | |
| 7,067,371 B2 | 6/2006 | Ning et al. | |
| 2001/0020722 A1* | 9/2001 | Yang | H01L 21/26533 257/347 |
| 2006/0099752 A1* | 5/2006 | Xiang | H01L 29/66636 438/197 |
| 2007/0057324 A1* | 3/2007 | Tews | H01L 29/6653 257/347 |
| 2007/0077695 A1* | 4/2007 | Jung | H01L 29/66772 438/164 |
| 2007/0099372 A1* | 5/2007 | Chittipeddi | H01L 21/76243 438/199 |
| 2008/0121994 A1* | 5/2008 | Dyer | H01L 29/66772 257/347 |
| 2008/0169490 A1* | 7/2008 | Kawai | H01L 21/84 257/288 |

* cited by examiner

*Primary Examiner* — Vongsavanh Sengdara
(74) *Attorney, Agent, or Firm* — Farjami & Farjami LLP (57) ABSTRACT

An integrated circuit that includes: providing a substrate including a support structure, a dielectric layer, and a variable thickness film processed to include the dielectric layer within a recess of the variable thickness film; forming a gate over the variable thickness film; and forming a channel and a source/drain within the variable thickness film.

8 Claims, 6 Drawing Sheets

INTEGRATED CIRCUIT EMPLOYING VARIABLE THICKNESS FILM

CROSS-REFERENCE TO RELATED APPLICATION(S)

The present application contains subject matter related to co-pending U.S. patent application Ser. No. 10/986,399. The related application is assigned to Advanced Micro Devices, Inc.

TECHNICAL FIELD

The present invention relates generally to integrated circuits, and more particularly to an integrated circuit employing a variable thickness film.

BACKGROUND ART

At the present time, electronic products are used in almost every aspect of life, and at the heart of these electronic products is the integrated circuit. Integrated circuits can be used in computers, cell-phones, televisions, digital cameras and even airplanes.

Integrated circuits are made in and on semiconductor wafers by extremely complex manufacturing methods that require the coordination of hundreds or even thousands of precisely controlled process steps. Once completed, each semiconductor wafer can have hundreds to tens of thousands of integrated circuits.

Integrated circuits are made up of hundreds to millions of individual components. Typical individual components may include active and passive devices. By way of example, one common active component is a semiconductor transistor and one common passive component is a capacitor. The most common and important semiconductor material employed is silicon, and some of the most preferred silicon-based semiconductor components are built of complementary metal oxide semiconductor ("CMOS") transistors.

CMOS components include both an n-channel metal-oxide semiconductor field-effect transistor ("MOSFET") and a p-channel MOSFET combined on a single silicon wafer. CMOS technology offers lower power consumption than other metal-oxide semiconductor technologies, since power is consumed only during the logic switching cycle and not in static conditions.

Improvements to current CMOS technology include using an insulating substrate (e.g.—silicon on insulator) and introducing strain or stress within the channel region of each n-channel and p-channel MOSFET. It is generally known that the stresses in MOSFET channels and the accompanying stress-induced carrier mobility increase can be altered by varying the thickness of the strained elements located in the adjacent source/drain regions. For example, by increasing the thickness of the strained elements located adjacent the channel region (i.e.—the source/drain regions) the drive current ($I_{on}$) of a MOSFET device may be increased. Unfortunately, for silicon on insulator technology, the thickness of the strained elements is naturally limited by the thickness of the silicon layer formed over the insulating layer.

Furthermore, one of the major drawbacks of improving $I_{on}$ (e.g.—by increasing the thickness of the silicon on insulator layer), is that a thicker silicon on insulator layer results in higher device leakage current ($I_{off}$) (e.g.—higher source/drain leakage currents). Regrettably, increases in $I_{off}$ due to thicker silicon on insulator layers negatively affect the ratio of ($I_{on}/I_{off}$), which is a common standard used to measure MOSFET performance.

Consequently, additional methods have been developed to enhance the ratio of ($I_{on}/I_{off}$). One such method increases stresses within the MOSFET channel region by positioning the strained source/drain elements closer to the channel regions of the MOSFET. Unfortunately, the potential of this approach has been exploited to its limit and further enhancement of the proximity effect between the MOSFET channel and the strained MOSFET source/drain regions raises the gate leakage current to an unacceptable level.

Thus, a need still remains for a reliable integrated circuit and method of fabrication, wherein the integrated circuit realizes enhanced device drive current while minimizing device leakage current. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit including: providing a substrate including a support structure, a dielectric layer, and a variable thickness film processed to include the dielectric layer within a recess of the variable thickness film; forming a gate over the variable thickness film; and forming a channel and a source/drain within the variable thickness film.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGS. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the support structure, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The terms "processed" or "processing" as used herein include deposition of material or photoresist, patterning, exposure, development, etching, cleaning, and/or removal of the material or photoresist as required in forming a described structure.

The term "example" is used herein to mean serving as an instance or illustration. Any aspect or embodiment described herein as an "example" is not necessarily to be construed as preferred or advantageous over other aspects or designs.

The term "system" as used herein means and refers to the method and to the apparatus of the present invention in accordance with the context in which the term is used.

The term "variable thickness film" as used herein is defined as a semiconductor layer processed to include a first thickness region beneath a MOSFET gate and a second thickness region within MOSFET source/drain areas, wherein the thickness of the first thickness region can be smaller or thinner than the thickness of the second thickness region.

Generally, the present invention is directed to the enhancement of transistor carrier mobility by employing a variable thickness silicon on insulator film. Uniquely, the present invention forms the variable thickness silicon on insulator film by processing the bottom surface of the film to form a recess that aligns with a channel area of a metal-oxide semiconductor field-effect transistor ("MOSFET") device to be located above the recess. After processing the bottom surface of the variable thickness silicon on insulator film to form the recess, a dielectric or insulator film is deposited over the bottom surface and within the recess to later form a buried oxide layer. The technique of the present invention provides a variable thickness silicon on insulator film with thin regions located beneath a MOSFET gate and thick regions located within MOSFET source/drain regions. By forming the variable thickness silicon on insulator film with thin regions below the gate and thick regions within the source/drain areas, the effectiveness of the stress transfer of a strained embedded source/drain region can be improved and the charge carrier mobility of the transistor can be enhanced, while leakage currents can be reduced.

Figure 1:
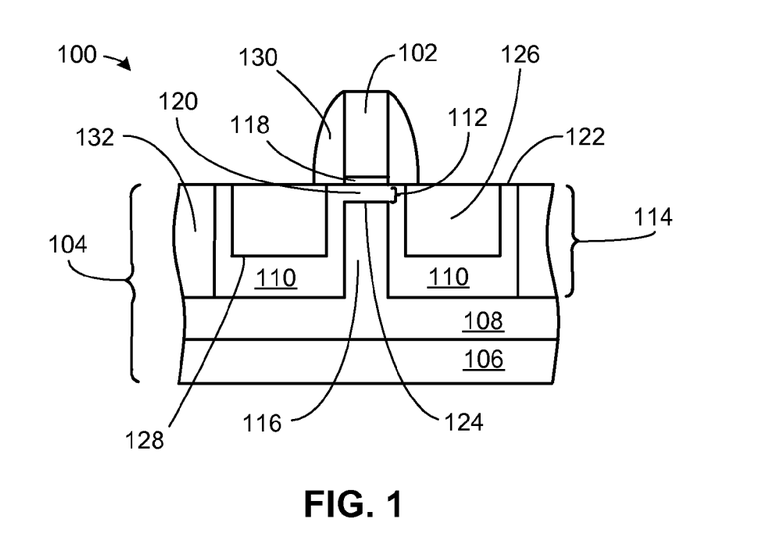
FIG. 1 is a cross-sectional view of an integrated circuit, in accordance with an embodiment of the present invention.

FIG. 1, which follows, depicts by way of example and not by limitation an exemplary integrated circuit and it is not to be construed as limiting. It is to be appreciated that the present disclosure need not be limited to the integrated circuit depicted by FIG. 1. Accordingly, the present invention may include any multi-electrode device in which the current flowing between two specified electrodes is controlled or modulated by the voltage applied at a control electrode. For example, a multi-electrode device may include an n-channel field effect transistor (NFET), a p-channel field effect transistor (PFET), a single-gate transistor, a multi-gate transistor and an annular gate transistor. Furthermore, it is to be understood that one or more of the integrated circuit could be prepared at one time on a medium, which could then be separated into individual or multiple integrated circuit assemblies at a later stage of fabrication.

Referring now to FIG. 1, therein is shown a cross sectional view of an integrated circuit 100, in accordance with an embodiment of the present invention. The integrated circuit 100 can be formed from conventional deposition, patterning, photolithography, and etching steps. By way of example, the integrated circuit 100 could be formed as part of or integrated with a printed circuit board.

The integrated circuit 100 includes a gate 102 formed over a substrate 104. The substrate 104 may further include a support structure 106, a dielectric layer 108, and a variable thickness film 110. In alternative embodiments, the support structure 106 may include any semiconducting material, for example, Si, SiC, SiGe, SiGeC, Ge, GaAs, InAs, InP as well as other III/V or II/VI compound semiconductors. Preferably, the support structure 106 is a silicon-containing substrate. The term "silicon-containing substrate" is used herein to denote a semiconductor material that includes at least silicon. Examples of a silicon-containing substrate include, but are not limited to: Si, SiGe, SiC, and/or SiGeC. In some other embodiments of the present invention, the support structure 106 can be a non-semiconducting material (e.g.—sapphire or other like non-semiconducting material). However, these examples are not to be construed as limiting and the composition of the support structure 106 may include any material that physically and electrically supports an active or passive device structure formed there over.

The dielectric layer 108 of the present embodiment can be used to electrically isolate the support structure 106 from the variable thickness film 110. The dielectric layer 108 may include a thermally grown or deposited oxide layer, a nitride layer, an oxynitride layer or any combination thereof, for example. Moreover, the dielectric layer 108 may be continuous, discontinuous, or a combination of continuous and discontinuous regions. Preferably, the dielectric layer 108 is a continuous layer formed from an oxide and may commonly be referred to as a buried insulation layer.

The variable thickness film 110 includes a first thickness region 112 and a second thickness region 114, both defined by a recess 116 formed within the variable thickness film 110. Generally, the thickness of the first thickness region 112 is different from the thickness of the second thickness region 114. For example, the thickness of the first thickness region 112 can be smaller or thinner than the thickness of the second thickness region 114.

The variable thickness film 110 may generally include a semiconducting material or a silicon-containing material (e.g.—Si, SiGe, SiC, or SiGeC). Preferably, the variable thickness film 110 is made from a silicon-containing material. However, these examples are not to be construed as limiting and the composition of the variable thickness film 110 may include any material that physically and electrically supports an active or passive device structure formed within or there over.

The gate 102 is formed over the variable thickness film 110 and may be formed of conventional materials including metals, semiconducting materials (e.g.—doped or undoped poly or amorphous silicon) or a combination thereof.

Below the gate 102 is a gate dielectric 118, and below the gate dielectric 118 is a channel 120. By way of example, the gate dielectric 118 may include silicon oxide, silicon oxynitride, silicon nitride, a silicon oxide/nitride/oxide stack or a high-k dielectric material (i.e.—one having a dielectric constant value greater than silicon oxide). However, it is to be understood that the type of material chosen for the gate dielectric 118 is not limited to the above examples; for example, the gate dielectric 118 may include any material that permits induction of a charge in the channel 120 when an appropriate voltage is applied to the gate 102.

Notably, the channel 120, which is formed within the variable thickness film 110 below the gate 102, is within the first thickness region 112 of the variable thickness film 110. The depth or thickness of the first thickness region 112 of the variable thickness film 110 can be defined as the distance between a variable thickness film top surface 122 and a recess bottom surface 124. It is to be understood that the thickness of the first thickness region 112 can be strategically adjusted by the depth of formation of the recess 116. Furthermore, it is to be understood that by strategically adjusting the thickness of the first thickness region 112 by altering the depth of formation of the recess 116, that the present invention helps to suppress short channel effects and source/drain leakage currents.

Additionally, depending upon the thickness of the variable thickness film 110 beneath the gate 102 (i.e.—the first thickness region 112), it is to be understood that the integrated circuit 100 may act in a fully depleted or partially depleted mode. For example, when the first thickness region 112 is about 100 angstroms or thinner, the gate 102 can control the electrical potential as well as the carrier depletion and accumulation across the whole of the first thickness region 112 and the integrated circuit 100 can operate in a fully depleted mode. Alternatively, when the first thickness region 112 is about 100 angstroms or greater, the integrated circuit 100 can operate in a partially depleted mode.

A source/drain 126 can be formed adjacent the channel 120 in the second thickness region 114 within the variable thickness film 110. The depth or thickness of the second thickness region 114 of the variable thickness film 110 can be defined as the distance between the variable thickness film top surface 122 and the dielectric layer 108. It is to be understood that the depth of a source/drain bottom surface 128 is only to be limited by the thickness of the second thickness region 114 and/or the desired depth of the source/drain 126. Notably, the dimensions of the second thickness region 114 allow the source/drain 126 to be formed thicker without causing adverse electrical consequences.

The present invention can form the source/drain 126 by processing (e.g.—via a chemical or physical etch) the variable thickness film 110 to form a source/drain trench that is subsequently filled by selective growth of a strained silicon-containing film, which will enhance charge carrier mobility in the channel 120 of the integrated circuit 100. By way of example, the strained silicon-containing film within the source/drain 126 may be made from selective epitaxial growth of silicon germanium (SiGe), silicon carbon (SiC), or silicon germanium carbide (SiGeC) depending upon the desired strain inducing characteristics for the channel 120.

However, it is to be understood that the method used to form the source/drain 126 is not critical to the invention, what is important is that the source/drain 126 include a strained silicon region, which enhances charge carrier mobility in the channel 120 of the integrated circuit 100. Furthermore, it is to be understood that the composition of the source/drain 126 is not to be limited to any particular type of material. In accordance with the present embodiment, the source/drain 126 may include any material that is engineered to induce strain within the channel 120.

By way of example, a potential aspect of the present invention may employ, within the source/drain 126, a concentration of germanium based on the total amount of silicon and germanium between about 10% to about 40%, or a concentration of carbon based on the total amount of silicon and carbon between about 0.5% to about 4%. However, it is to be understood that the exact concentration of germanium and/or carbon employed is not critical to the practice of the present invention and that the concentration of germanium and/or carbon employed should only be limited by its desired strain inducing effect upon the channel 120.

Additionally, it is to be understood that doped regions within the source/drain 126, which provide electrical conductivity, can be optionally formed during or after the epitaxial growth and annealed as required.

It has been discovered by the inventor of the present invention that the strain introduced by the source/drain 126 within the channel 120 increases substantially with the reduction of the thickness of the first thickness region 112 beneath the gate 102, thereby helping to improve the performance of the integrated circuit 100. It will be appreciated by those skilled in the art that transistor channel strain and charge carrier mobility can be proportionally related to the thickness of strained adjacent source/drain regions and that an appropriately applied strain to the channel region of a multi-electrode device may enhance the amount of current that can flow through the device. Notably, the present invention allows for the formation of the source/drain 126 within a thicker portion of the variable thickness film 110 (i.e.—the second thickness region 114), thereby providing an enhanced increase in channel strain and charge carrier mobility within the integrated circuit 100.

A spacer 130 is formed adjacent the gate 102 by depositing an insulating material over the gate 102 and then etching the insulating material. By way of example, the spacer 130 may include a material selected from an oxide, a nitride, an oxynitride, or a combination thereof, wherein the composition chosen may depend upon the desired etch selectivity of the spacer 130. The spacer 130 may be formed before or after the formation of the source/drain 126 and the order of its formation may depend upon, for example, the strategic design of the source/drain 126 being aligned with the spacer 130. Additionally, the present invention may also use the thickness of the spacer 130 to maximize the proximity effect of the source/drain 126 upon the channel 120.

An isolation structure 132 can optionally be formed in the substrate 104 for electrically isolating adjacent structures from the integrated circuit 100. By way of example, the isolation structure 132 may commonly be referred to as a shallow trench isolation structure and may be filled with an insulating material, or more preferably an oxide.

FIGS. 2-5 depict by way of example and not by limitation, an exemplary process flow for the formation of the substrate 104 of the integrated circuit 100, both of FIG. 1, and they are not to be construed as limiting. Since the structure and elements of FIGS. 2-5 are similar to the structure and elements of FIG. 1, identical numerals have been used and explanations thereof are omitted. Furthermore, it is to be understood that many modifications, additions, and/or omissions may be made to the process of FIGS. 2-5 without departing from the scope or spirit of the claimed subject matter. For example, the process may include more, fewer, or other steps.

Figure 2:
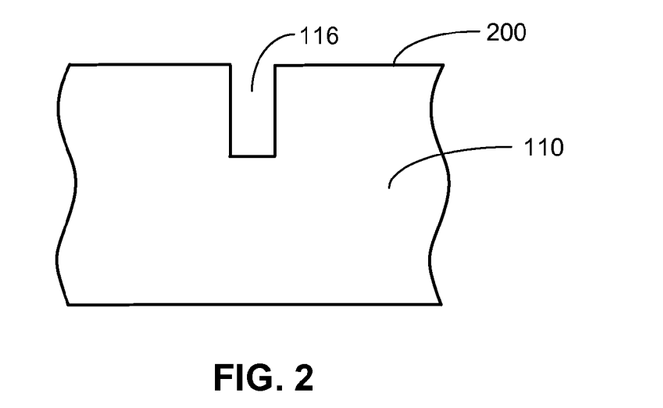
FIG. 2 is a variable thickness film in an initial stage of manufacture, in accordance with an embodiment of the present invention.

Referring now to FIG. 2, therein is shown the variable thickness film 110 in an initial stage of manufacture, in accordance with an embodiment of the present invention. Per this embodiment, the variable thickness film 110 has been processed to form the recess 116 within a variable thickness film bottom surface 200. Generally, the depth of the recess 116 is determined by the design dimensions of the first thickness region 112, of FIG. 1, and the second thickness region 114, of FIG. 1, and should not exceed the total thickness of the variable thickness film 110. By way of example, the recess 116 can be formed by conventional chemical or physical etching techniques that are well known within the art and not repeated herein.

The recess 116 is typically formed within an area of the variable thickness film 110 that will correspond with a later formed structure. For example, the location of the recess 116 can be strategically positioned to substantially align with an area of the variable thickness film 110 that will coincide with the channel 120 of the integrated circuit 100, both of FIG. 1. It has been discovered by the present inventor that forming the recess 116 within an area of the variable thickness film 110, that will later correspond with a subsequent formed channel region (e.g.—the channel 120), that short channel effects and source/drain leakage currents ($I_{off}$) can be greatly reduced. In other words, by aligning and forming the recess 116 under the location of a later formed gate structure, the variable thickness film 110 will be thinner under the gate 102, of FIG. 1, than it is within the source/drain 126, of FIG. 1, thereby helping to improving the ($I_{on}/I_{off}$) ratio of the integrated circuit 100.

It is to be understood that the variable thickness film 110 may be part of a wafer carrier or other support medium that permits transport and/or processing of the variable thickness film 110, which can be later separated.

Figure 3:
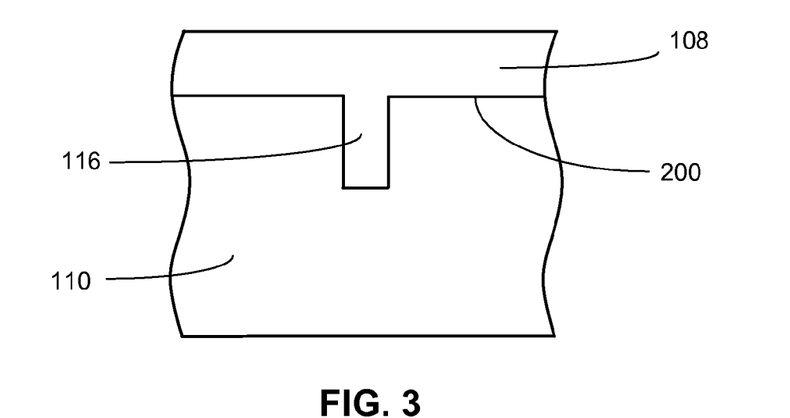
FIG. 3 is the structure of FIG. 2 after processing, in accordance with an embodiment of the present invention.

Referring now to FIG. 3, therein is shown the structure of FIG. 2 after processing, in accordance with an embodiment of the present invention. The dielectric layer 108 has been formed over the variable thickness film 110. More specifically, the dielectric layer 108 has been formed over the variable thickness film bottom surface 200 and within the recess 116.

Figure 4:
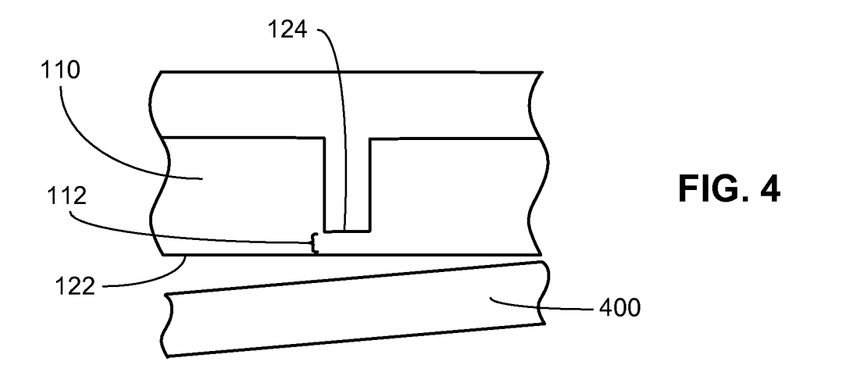
FIG. 4 is the structure of FIG. 3 after further processing, in accordance with an embodiment of the present invention.

Referring now to FIG. 4, therein is shown the structure of FIG. 3 after further processing, in accordance with an embodiment of the present invention. Per this embodiment, the variable thickness film 110 is processed to remove a film carrier 400, thereby exposing the variable thickness film top surface 122. The film carrier 400 is an optional layer that can provide support to the variable thickness film 110 during previous processing steps.

By way of example, the film carrier 400 can be removed by applying an amount of energy, for example, mechanical, thermal, acoustical or optical, at the interface of the film carrier 400 and the variable thickness film 110. In an aspect of a preferred embodiment, Smart-Cut™ process technology may be used for removing the variable thickness film 110 from the film carrier 400. As is evident from the disclosure herein, Smart-Cut process technology may include a hydrogen implantation step for creating a damage region at a specific depth within the variable thickness film 110 that is parallel to a surface of the variable thickness film 110. The film carrier 400 is then later separated from the variable thickness film 110 along the hydrogen implanted damage region. However, in accordance with the scope of the present invention, it is to be understood that other conventional silicon-on-insulator separation technology processes may also be employed.

It is to be understood that the separation of the film carrier 400 may also control or help modify the thickness of the variable thickness film 110 between the recess bottom surface 124 and the variable thickness film top surface 122 (i.e.—the first thickness region 112).

Figure 5:
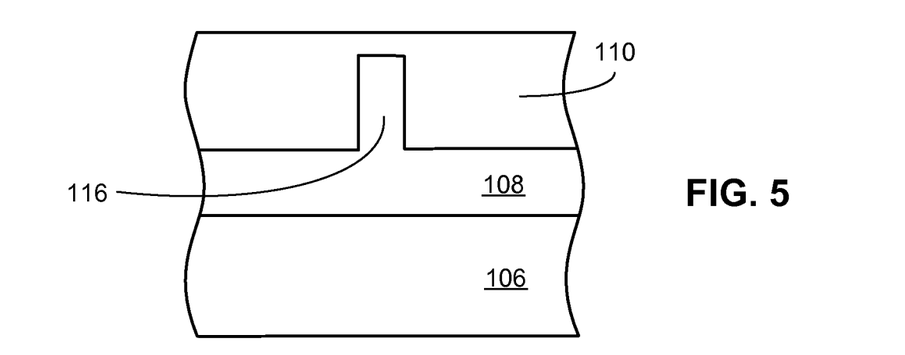
FIG. 5 is the structure of FIG. 4 after further processing, in accordance with an embodiment of the present invention.

Referring now to FIG. 5, therein is shown the structure of FIG. 4 after further processing, in accordance with an embodiment of the present invention. After removal of the film carrier 400, of FIG. 4, the variable thickness film 110 is inverted and the dielectric layer 108 is aligned and formed over the support structure 106. By way of example, the support structure 106 may include a handle wafer.

This illustration depicts the varied nature of the thickness of the variable thickness film 110. For example, regions located above the recess 116 are thinner than regions located adjacent the recess 116. It has been discovered by the present inventor that by strategically engineering the variable thickness film 110 to include thick and thin regions, that electrical properties of an appropriately aligned device formed there over can be enhanced.

Figure 6:
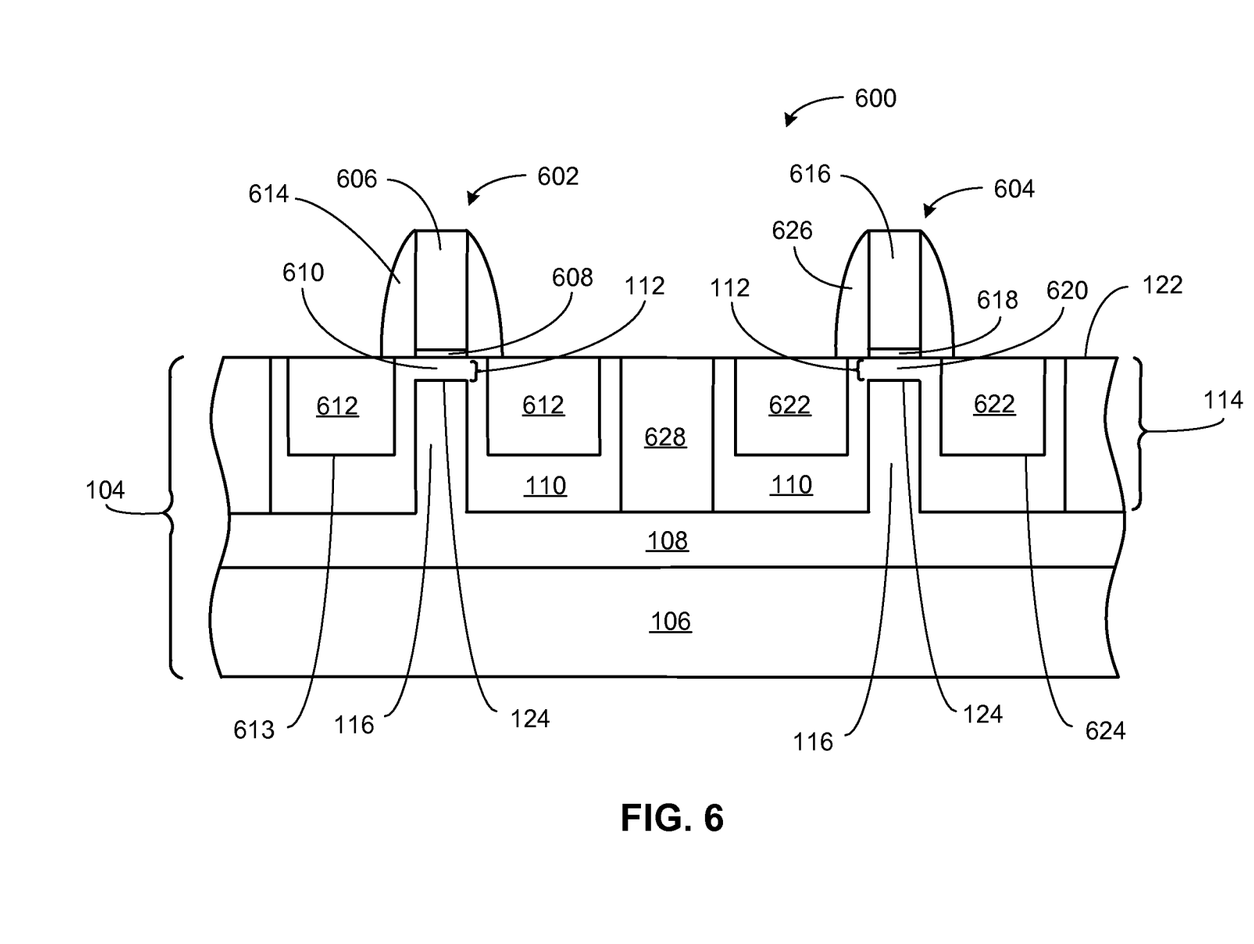
FIG. 6 is a cross-sectional view of an integrated circuit, in accordance with another embodiment of the present invention.

Referring now to FIG. 6. FIG. 6 generally depicts the variable thickness layer technique applied to adjacent multi-electrode devices.

FIG. 6 depicts by way of example and not by limitation, an exemplary structure of an integrated circuit 600, and it is not to be construed as limiting. It is to be appreciated that the present disclosure need not be limited to the integrated circuit 600 depicted by FIG. 6. Accordingly, the present invention includes any multi-electrode device formed adjacent another multi-electrode device, in which the current flowing between two specified electrodes of each device is controlled or modulated by the voltage applied at a control electrode for each device. For example, the integrated circuit 600 may include a complementary metal-oxide-semiconductor (CMOS) configuration or a CMOS configuration with different gate heights. Furthermore, it is to be understood that one or more of the integrated circuit 600 could be prepared at one time on a medium, which could be separated into individual or multiple integrated circuit device assemblies at a later stage of fabrication.

FIG. 6 shows a cross-sectional view of the integrated circuit 600, in accordance with another embodiment of the present invention. The integrated circuit 600 can be formed from conventional deposition, patterning, photolithography, and etching to form an NFET device 602 and a PFET device 604. The NFET device 602 and the PFET device 604 may operate together, thereby forming a CMOS configuration. By way of example, the integrated circuit 600 could be formed as part of or integrated with a printed circuit board.

The integrated circuit 600 includes an NFET gate 606 formed over the substrate 104. The substrate 104 may further include the support structure 106, the dielectric layer 108, and the variable thickness film 110. In alternative embodiments, the support structure 106 may include any semiconducting material, for example, Si, SiC, SiGe, SiGeC, Ge, GaAs, InAs, InP as well as other III/V or II/VI compound semiconductors. Preferably, the support structure 106 is a silicon-containing substrate. The term "silicon-containing substrate" is used herein to denote a semiconductor material that includes at least silicon. Examples of a silicon-containing substrate include, but are not limited to: Si, SiGe, SiC, and/or SiGeC. In some other embodiments of the present invention, the support structure 106 can be a non-semiconducting material (e.g.—sapphire or other like non-semiconducting material). However, these examples are not to be construed as limiting and the composition of the support structure 106 may include any material that physically and electrically supports an active or passive device structure formed there over.

The dielectric layer 108 of the present embodiment can be used to electrically isolate the support structure 106 from the variable thickness film 110. The dielectric layer 108 may include a thermally grown or deposited oxide layer, a nitride layer, an oxynitride layer or any combination thereof, for example. Moreover, the dielectric layer 108 may be continuous, discontinuous, or a combination of continuous and discontinuous regions. Preferably, the dielectric layer 108 is a continuous layer formed from an oxide and may commonly be referred to as a buried insulation layer.

The variable thickness film 110 includes the first thickness region 112 and the second thickness region 114, both defined by the recess 116 formed within the variable thickness film 110. Generally, the thickness of the first thickness region 112 is different from the thickness of the second thickness region 114. For example, the thickness of the first thickness region 112 can be smaller or thinner than the thickness of the second thickness region 114.

The variable thickness film 110 may generally include a semiconducting material or a silicon-containing material (e.g.—Si, SiGe, SiC, or SiGeC). Preferably, the variable thickness film 110 is made from a silicon-containing material. However, these examples are not to be construed as limiting and the composition of the variable thickness film 110 may include any material that physically and electrically supports an active or passive device structure formed within or there over.

The NFET gate 606 is formed over the variable thickness film 110 and may be formed of conventional materials including metals, semiconducting materials (e.g.—doped or undoped poly or amorphous silicon) or a combination thereof.

Below the NFET gate 606 is an NFET gate dielectric 608, and below the NFET gate dielectric 608 is an NFET channel 610. By way of example, the NFET gate dielectric 608 may include silicon oxide, silicon oxynitride, silicon nitride, a silicon oxide/nitride/oxide stack or a high-k dielectric material (i.e.—one having a dielectric constant value greater than silicon oxide). However, it is to be understood that the type of material chosen for the NFET gate dielectric 608 is not limited to the above examples; for example, the NFET gate dielectric 608 may include any material that permits induction of a charge in the NFET channel 610 when an appropriate voltage is applied to the NFET gate 606.

Notably, the NFET channel 610, which is formed within the variable thickness film 110 below the NFET gate 606, is within the first thickness region 112 of the variable thickness film 110. The depth or thickness of the first thickness region 112 of the variable thickness film 110 can be defined as the distance between the variable thickness film top surface 122 and the recess bottom surface 124. It is to be understood that the thickness of the first thickness region 112 can be strategically adjusted by the depth of formation of the recess 116. Furthermore, it is to be understood that by strategically adjusting the thickness of the first thickness region 112 by altering the depth of formation of the recess 116, that the present invention helps to suppress short channel effects and source/drain leakage currents.

Additionally, depending upon the thickness of the variable thickness film 110 beneath the NFET gate 606 (i.e.—the first thickness region 112), it is to be understood that the integrated circuit 600 may act in a fully depleted or partially depleted mode. For example, when the first thickness region 112 is about 100 angstroms or thinner, the NFET gate 606 can control the electrical potential as well as the carrier depletion and accumulation across the whole of the first thickness region 112 and the integrated circuit 600 can operate in a fully depleted mode. Alternatively, when the first thickness region 112 is about 100 angstroms or greater, the integrated circuit 600 can operate in a partially depleted mode.

An NFET source/drain 612 can be formed adjacent the NFET channel 610 in the second thickness region 114 within the variable thickness film 110. The depth or thickness of the second thickness region 114 of the variable thickness film 110 can be defined as the distance between the variable thickness film top surface 122 and the dielectric layer 108. It is to be understood that the depth of an NFET source/drain bottom surface 613 is only to be limited by the thickness of the second thickness region 114 and/or the desired depth of the NFET source/drain 612. Notably, the dimensions of the second thickness region 114 allow the NFET source/drain 612 to be formed thicker without causing adverse electrical consequences.

The present invention can form the NFET source/drain 612 by processing (e.g.—via a chemical or physical etch) the variable thickness film 110 to form a source/drain trench that is subsequently filled by selective growth of a strained silicon-containing film, which will enhance charge carrier mobility in the NFET channel 610 of the integrated circuit 600. By way of example, the strained silicon-containing film within the NFET source/drain 612 may be made from selective epitaxial growth of silicon carbon (Si:C) that provides the desired tensile strain inducing characteristics for the NFET channel 610.

However, it is to be understood that the method used to form the NFET source/drain 612 is not critical to the invention, what is important is that the NFET source/drain 612 include a strained silicon region, which enhances charge carrier mobility in the NFET channel 610 of the integrated circuit 600. Furthermore, it is to be understood that the composition of the NFET source/drain 612 is not to be limited to any particular type of material. In accordance with the present embodiment, the NFET source/drain 612 may include any material that is engineered to induce strain within the NFET channel 610.

By way of example, a potential aspect of the present invention may employ, within the NFET source/drain 612, a concentration of carbon based on the total amount of silicon and carbon between about 0.5% to about 4%. However, it is to be understood that the exact concentration of carbon employed is not critical to the practice of the present invention and that the concentration of carbon employed should only be limited by its desired strain inducing effect upon the NFET channel 610.

Additionally, it is to be understood that doped regions within the NFET source/drain 612, which provide electrical conductivity, can be optionally formed during or after the epitaxial growth and annealed as required.

It has been discovered by the inventor of the present invention that the strain introduced by the NFET source/drain 612 within the NFET channel 610 increases substantially with the reduction of the thickness of the first thickness region 112 beneath the NFET gate 606, thereby helping to improve the performance of the integrated circuit 600. It will be appreciated by those skilled in the art that transistor channel strain and charge carrier mobility can be proportionally related to the thickness of strained adjacent source/drain regions and that an appropriately applied strain to the channel region of a multi-electrode device may enhance the amount of current that can flow through the device. Notably, the present invention allows for the formation of the NFET source/drain 612 within a thicker portion of the variable thickness film 110 (i.e.—the second thickness region 114), thereby providing an enhanced increase in channel strain and charge carrier mobility within the integrated circuit 600.

An NFET spacer 614 is formed adjacent the NFET gate 606 by depositing an insulating material over the NFET gate 606 and then etching the insulating material. By way of example, the NFET spacer 614 may include a material selected from an oxide, a nitride, an oxynitride, or a combination thereof, wherein the composition chosen may depend upon the desired etch selectivity of the NFET spacer 614. The NFET spacer 614 may be formed before or after the formation of the NFET source/drain 612 and the order of its formation may depend upon, for example, the strategic design of the NFET source/drain 612 being aligned with the NFET spacer 614. Additionally, the present invention may also use the thickness of the NFET spacer 614 to maximize the proximity effect of the NFET source/drain 612 upon the NFET channel 610.

Additionally, the integrated circuit 600 includes a PFET gate 616 formed over the variable thickness film 110. The PFET gate 616 may be formed of conventional materials including metals, semiconducting materials (e.g.—doped or undoped poly or amorphous silicon) or a combination thereof.

Below the PFET gate 616 is a PFET gate dielectric 618, and below the PFET gate dielectric 618 is a PFET channel 620. By way of example, the PFET gate dielectric 618 may include silicon oxide, silicon oxynitride, silicon nitride, a silicon oxide/nitride/oxide stack or a high-k dielectric material (i.e. —one having a dielectric constant value greater than silicon oxide). However, it is to be understood that the type of material chosen for the PFET gate dielectric 618 is not limited to the above examples; for example, the PFET gate dielectric 618 may include any material that permits induction of a charge in the PFET channel 620 when an appropriate voltage is applied to the PFET gate 616.

Notably, the PFET channel 620, which is formed within the variable thickness film 110 below the PFET gate 616, is within the first thickness region 112 of the variable thickness film 110. The depth or thickness of the first thickness region 112 of the variable thickness film 110 can be defined as the distance between the variable thickness film top surface 122 and the recess bottom surface 124. It is to be understood that the thickness of the first thickness region 112 can be strategically adjusted by the depth of formation of the recess 116. Furthermore, it is to be understood that by strategically adjusting the thickness of the first thickness region 112 by altering the depth of formation of the recess 116, that the present invention helps to suppress short channel effects and source/drain leakage currents.

Additionally, depending upon the thickness of the variable thickness film 110 beneath the PFET gate 616 (i.e.—the first thickness region 112), it is to be understood that the integrated circuit 600 may act in a fully depleted or partially depleted mode. For example, when the first thickness region 112 is about 100 angstroms or thinner, the PFET gate 616 can control the electrical potential as well as the carrier depletion and accumulation across the whole of the first thickness region 112 and the integrated circuit 600 can operate in a fully depleted mode. Alternatively, when the first thickness region 112 is about 100 angstroms or greater, the integrated circuit 600 can operate in a partially depleted mode.

A PFET source/drain 622 can be formed adjacent the PFET channel 620 in the second thickness region 114 within the variable thickness film 110. The depth or thickness of the second thickness region 114 of the variable thickness film 110 can be defined as the distance between the variable thickness film top surface 122 and the dielectric layer 108. It is to be understood that the depth of a PFET source/drain bottom surface 624 is only to be limited by the thickness of the second thickness region 114 and/or the desired depth of the PFET source/drain 622. Notably, the dimensions of the second thickness region 114 allow the PFET source/drain 622 to be formed thicker without causing adverse electrical consequences.

The present invention can form the PFET source/drain 622 by processing (e.g.—via a chemical or physical etch) the variable thickness film 110 to form a source/drain trench that is subsequently filled by selective growth of a strained silicon-containing film, which will enhance charge carrier mobility in the PFET channel 620 of the integrated circuit 600. By way of example, the strained silicon-containing film within the PFET source/drain 622 may be made from selective epitaxial growth of silicon germanium (SiGe) or silicon germanium carbide (SiGeC), which provides the desired compressive strain inducing characteristics for the PFET channel 620.

However, it is to be understood that the method used to form the PFET source/drain 622 is not critical to the invention, what is important is that the PFET source/drain 622 include a strained silicon region, which enhances charge carrier mobility in the PFET channel 620 of the integrated circuit 600. Furthermore, it is to be understood that the composition of the PFET source/drain 622 is not to be limited to any particular type of material. In accordance with the present embodiment, the PFET source/drain 622 may include any material that is engineered to induce strain within the PFET channel 620.

By way of example, a potential aspect of the present invention may employ, within the PFET source/drain 622, a concentration of germanium based on the total amount of silicon and germanium between about 10% to about 40%.

However, it is to be understood that the exact concentration of germanium employed is not critical to the practice of the present invention and that the concentration of germanium employed should only be limited by its desired strain inducing effect upon the PFET channel 620.

Additionally, it is to be understood that doped regions within the PFET source/drain 622, which provide electrical conductivity, can be optionally formed during or after the epitaxial growth and annealed as required.

It has been discovered by the inventor of the present invention that the strain introduced by the PFET source/drain 622 within the PFET channel 620 increases substantially with the reduction of the thickness of the first thickness region 112 beneath the PFET gate 616, thereby helping to improve the performance of the integrated circuit 600. It will be appreciated by those skilled in the art that transistor channel strain and charge carrier mobility can be proportionally related to the thickness of strained adjacent source/drain regions and that an appropriately applied strain to the channel region of a multi-electrode device may enhance the amount of current that can flow through the device. Notably, the present invention allows for the formation of the PFET source/drain 622 within a thicker portion of the variable thickness film 110 (i.e.—the second thickness region 114), thereby providing an enhanced increase in channel strain and charge carrier mobility within the integrated circuit 600.

A PFET spacer 626 is formed adjacent the PFET gate 616 by depositing an insulating material over the PFET gate 616 and then etching the insulating material. By way of example, the PFET spacer 626 may include a material selected from an oxide, a nitride, an oxynitride, or a combination thereof, wherein the composition chosen may depend upon the desired etch selectivity of the PFET spacer 626. The PFET spacer 626 may be formed before or after the formation of the PFET source/drain 622 and the order of its formation may depend upon, for example, the strategic design of the PFET source/drain 622 being aligned with the PFET spacer 626. Additionally, the present invention may also use the thickness of the PFET spacer 626 to maximize the proximity effect of the PFET source/drain 622 upon the PFET channel 620.

An isolation structure 628 can optionally be formed in the substrate 104 for electrically isolating adjacent structures, for example, the NFET device 602 and the PFET device 604 of the integrated circuit 600. By way of example, the isolation structure 628 may commonly be referred to as a shallow trench isolation structure and may be filled with an insulating material, or more preferably an oxide.

FIGS. 7-10 depict by way of example and not by limitation, an exemplary process flow for the formation of the substrate 104 of the integrated circuit 600, both of FIG. 6, and they are not to be construed as limiting. Since the structure and elements of FIGS. 7-10 are similar to the structure and elements of FIG. 6, identical numerals have been used and explanations thereof are omitted. Furthermore, it is to be understood that many modifications, additions, and/or omissions may be made to the process of FIGS. 7-10 without departing from the scope or spirit of the claimed subject matter. For example, the process may include more, fewer, or other steps.

Figure 7:
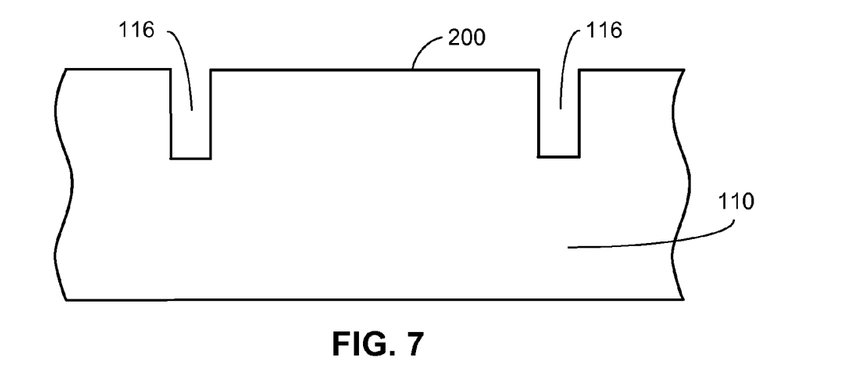
FIG. 7 is a variable thickness film in an initial stage of manufacture, in accordance with an embodiment of the present invention.

Referring now to FIG. 7, therein is shown the variable thickness film 110 in an initial stage of manufacture, in accordance with an embodiment of the present invention. Per this embodiment, the variable thickness film 110 has been processed to form the recess 116 within the variable thickness film bottom surface 200. Generally, the depth of the recess 116 is determined by the design dimensions of the first thickness region 112, of FIG. 6, and the second thickness region 114, of FIG. 6, and should not exceed the total thickness of the variable thickness film 110. By way of example, the recess 116 can be formed by conventional chemical or physical etching techniques that are well known within the art and not repeated herein.

The recess 116 is typically formed within an area of the variable thickness film 110 that will correspond with a later formed structure. For example, the location of the recess 116 can be strategically positioned to substantially align with an area of the variable thickness film 110 that will coincide with the NFET channel 610 and/or the PFET channel 620 of the integrated circuit 600, all of FIG. 6. It has been discovered by the present inventor that forming the recess 116 within an area of the variable thickness film 110, that will later correspond with a subsequent formed channel region (e.g.— the NFET channel 610 and/or the PFET channel 620), that short channel effects and source/drain leakage currents ($I_{off}$) can be greatly reduced. In other words, by aligning and forming the recess 116 under the location of a later formed gate structure, the variable thickness film 110 will be thinner under the NFET gate 606 and/or the PFET gate 616, both of FIG. 6, than it is within the NFET source/drain 612 and/or the PFET source/drain 622, both of FIG. 6, thereby helping to improving the ($I_{on}/I_{off}$) ratio of the integrated circuit 600.

It is to be understood that the variable thickness film 110 may be part of a wafer carrier or other support medium that permits transport and/or processing of the variable thickness film 110, which can be later separated.

Figure 8:
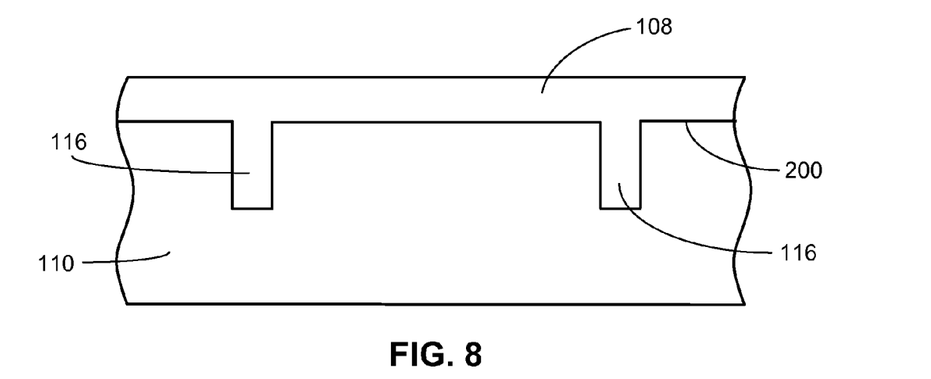
FIG. 8 is the structure of FIG. 7 after processing, in accordance with an embodiment of the present invention.

Referring now to FIG. 8, therein is shown the structure of FIG. 7 after processing, in accordance with an embodiment of the present invention. The dielectric layer 108 has been formed over the variable thickness film 110. More specifically, the dielectric layer 108 has been formed over the variable thickness film bottom surface 200 and within the recess 116.

Figure 9:
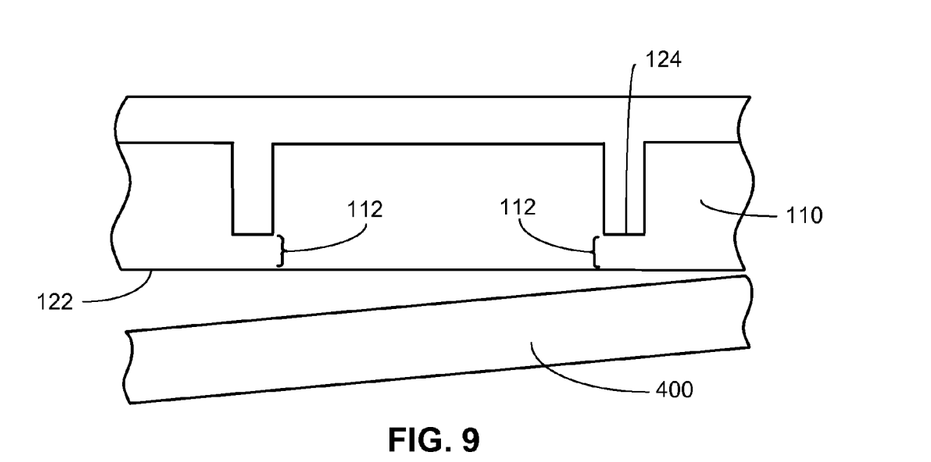
FIG. 9 is the structure of FIG. 8 after further processing, in accordance with an embodiment of the present invention.

Referring now to FIG. 9, therein is shown the structure of FIG. 8 after further processing, in accordance with an embodiment of the present invention. Per this embodiment, the variable thickness film 110 is processed to remove the film carrier 400, thereby exposing the variable thickness film top surface 122. The film carrier 400 is an optional layer that can provide support to the variable thickness film 110 during previous processing steps.

By way of example, the film carrier 400 can be removed by applying an amount of energy, for example, mechanical, thermal, acoustical or optical, at the interface of the film carrier 400 and the variable thickness film 110. In an aspect of a preferred embodiment, Smart-Cut™ process technology may be used for removing the variable thickness film 110 from the film carrier 400. As is evident from the disclosure herein, Smart-Cut process technology may include a hydrogen implantation step for creating a damage region at a specific depth within the variable thickness film 110 that is parallel to a surface of the variable thickness film 110. The film carrier 400 is then later separated from the variable thickness film 110 along the hydrogen implanted damage region. However, in accordance with the scope of the present invention, it is to be understood that other conventional silicon-on-insulator separation technology processes may also be employed.

It is to be understood that the separation of the film carrier 400 may also control or help modify the thickness of the variable thickness film 110 between the recess bottom surface 124 and the variable thickness film top surface 122 (i.e.—the first thickness region 112).

Figure 10:
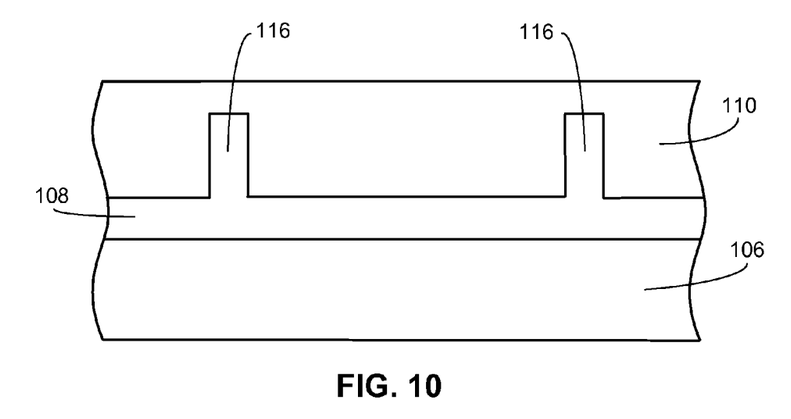
FIG. 10 the structure of FIG. 9 after further processing, in accordance with an embodiment of the present invention.

Referring now to FIG. 10, therein is shown the structure of FIG. 9 after further processing, in accordance with an embodiment of the present invention. After removal of the film carrier 400, of FIG. 9, the variable thickness film 110 is inverted and the dielectric layer 108 is aligned and formed over the support structure 106. By way of example, the support structure 106 may include a handle wafer.

This illustration depicts the varied nature of the thickness of the variable thickness film 110. For example, regions located above the recess 116 are thinner than regions located adjacent the recess 116. It has been discovered by the present inventor that by strategically engineering the variable thickness film 110 to include thick and thin regions, that electrical properties of an appropriately aligned device formed there over can be enhanced.

Figure 11:
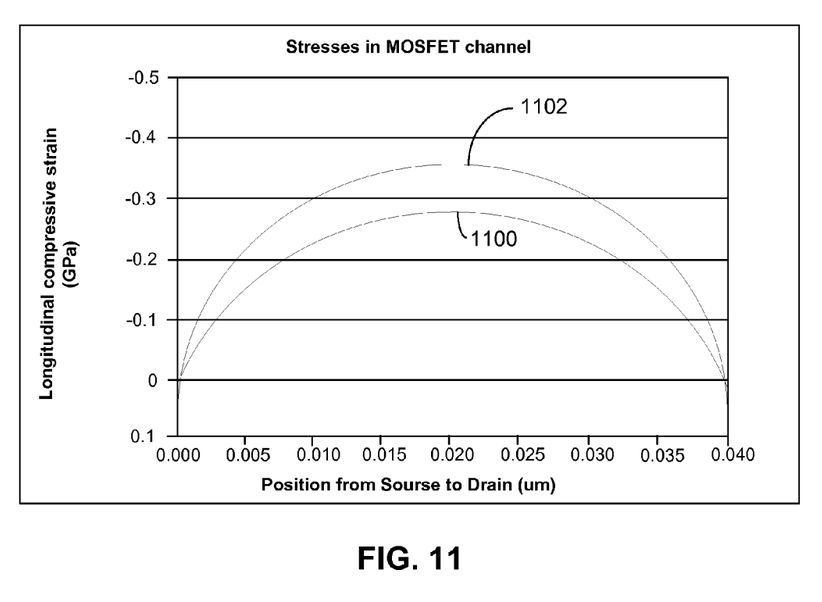
FIG. 11 is a graphical representation of longitudinal compressive strain plotted against position from source to drain for a conventional MOSFET device 1100 and a variable thickness film MOSFET device 1102 both possessing SiGe PFET source and drain regions embedded with 20% Ge, in accordance with an embodiment of the present invention.

Referring now to FIG. 11, therein is shown a graphical representation of longitudinal compressive strain plotted against position from source to drain for a conventional MOSFET device 1100 and a variable thickness film MOSFET device 1102 both possessing SiGe PFET source and drain regions embedded with 20% Ge, in accordance with an embodiment of the present invention. Per this embodiment, the conventional MOSFET device 1100 employs a non-varying thickness silicon-on-insulator film (i.e.—the thickness of the silicon-on-insulator film in the channel region and source/drain regions are equal) and the variable thickness film MOSFET device 1102 employs the variable thickness film 110, of FIGS. 1 and 6. The MOSET channel length for each of the conventional MOSFET device 1100 and the variable thickness film MOSFET device 1102 is approximately forty (40) nanometers and the plotted compressive strain is extracted from a channel depth of five (5) nanometers. Additionally, the thickness of the silicon-on-insulator film in the source/drain region of the conventional MOSFET device 1100 is substantially equivalent to the thickness of the variable thickness film 110 in the source/drain region of the variable thickness film MOSFET device 1102.

Notably, the graph depicts an increase in the strain within the channel region of the variable thickness film MOSFET device 1102 by about 20% to about 30% over that of the strain within the channel region of the conventional MOSFET device 1100. Therefore, even for structures with similar layer thickness in the source/drain regions, an improvement in MOSFET device performance (e.g.—an increase in device drive current) can be achieved. It has been discovered by the present inventor that the combination of a thick source/drain region formed adjacent a thin channel region (e.g.—by forming the recess 116 within the variable thickness film 110, both of FIGS. 1 and 6) by the method of the current invention can lead to increases in device drive current while minimizing device leakage current.

Figure 12A:
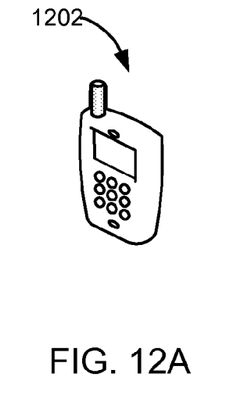
FIGS. 12A, 12B and 12C are schematic views of examples of electronics systems in which various aspects of the present invention may be implemented.
Figure 12B:
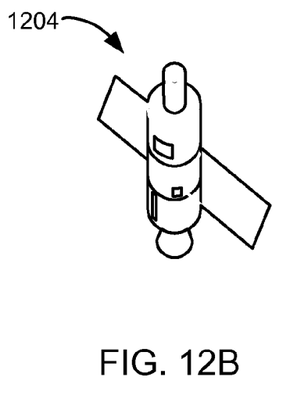
Figure 12C:
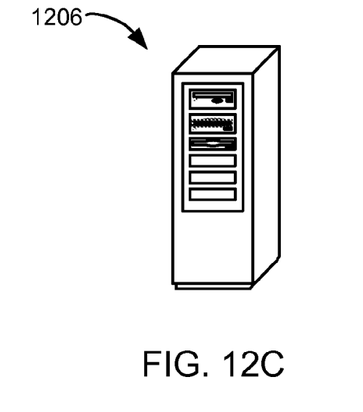

Referring now to FIGS. 12A, 12B and 12C, therein are shown schematic views of examples of electronics systems in which various aspects of the present invention may be implemented. A smart phone 1202, a satellite 1204, and a computer system 1206 are examples of the electronic systems using the present invention. The electronic systems may be any system that performs any function for the creation, transportation, storage, and consumption of information. For example, the smart phone 1202 may create information by transmitting voice to the satellite 1204. The satellite 1204 can be used to transport the information to the computer system 1206. The computer system 1206 may be used to store the information. The smart phone 1202 may also consume information sent from the satellite 1204.

The electronic systems, such as the smart phone 1202, the satellite 1204, and the computer system 1206, include a one or more subsystem, such as a printed circuit board having the present invention or an electronic assembly having the present invention. The electronic system may also include a subsystem, such as an adapter card.

Figure 13:
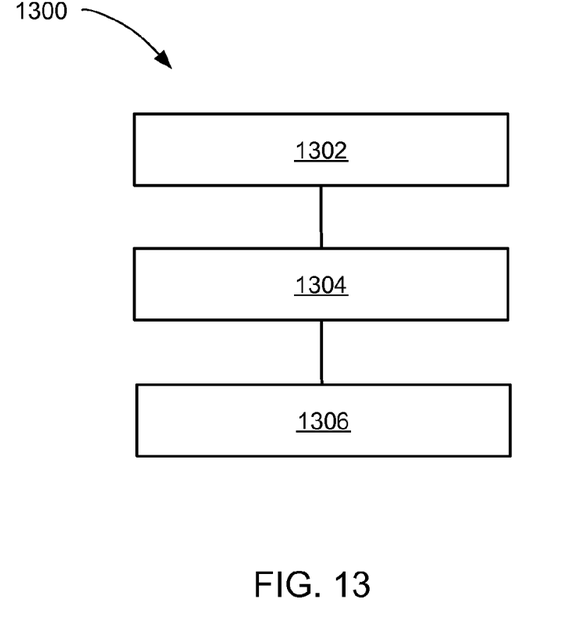
FIG. 13 is a flow chart of an integrated circuit for the integrated circuit, in accordance with an embodiment of the present invention.

Referring now to FIG. 13, therein is shown a flow chart of an integrated circuit 1300 for the integrated circuit 100 and 600 in accordance with an embodiment of the present invention. The integrated circuit 1300 includes providing a substrate including a support structure, a dielectric layer, and a variable thickness film processed to include the dielectric layer within a recess of the variable thickness film in a block 1302; forming a gate over the variable thickness film in a block 1304; and forming a channel and a source/drain within the variable thickness film in a block 1306.

It has been discovered that the present invention thus has numerous aspects. One such potential aspect is that the present invention can increase device drive current while minimizing device leakage current of a multi-electrode device by forming a variable thickness film with thinner regions below a gate structure and thicker regions within source/drain areas.

Another potential aspect of the present invention is that the variable thickness film helps to increase the operating range and speed of a multi-electrode device, while improving the signal to noise ratio. The present invention achieves these potential aspects by utilizing a variable thickness film, which has been shown to increase device drive current while minimizing device leakage current.

Another potential aspect is that the present invention improves the reliability and efficiency of a multi-electrode device by suppressing short channel effects and source/drain leakage currents.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit of the present invention furnishes important and heretofore unknown and unavailable solutions, capabilities, and functional aspects for increasing device drive current while minimizing device leakage current. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit comprising:
   a substrate including a support structure, a dielectric layer having a substantially continuous planar bottom surface forming an interface with said support structure, and a variable thickness film, said variable thickness film being a single semiconductor layer and having a substantially continuous planar top surface;

at least one recess within a bottom surface of the variable thickness film, wherein the dielectric layer does not only line the at least one recess but completely fills the at least one recess, and wherein the dielectric layer separates the variable thickness film from said support structure at all points with the dielectric layer being directly on the support structure and the variable thickness film being directly on the dielectric layer;

at least one gate over the variable thickness film, the at least one gate situated at the substantially continuous planar top surface of the variable thickness film, wherein said at least one recess being directly under and aligned with said at least one gate, and a width of said at least one recess is substantially equal to a width of said at least one gate;

at least one channel and at least one source/drain within the variable thickness film, wherein said variable thickness film substantially surrounds said at least one source/drain, wherein the at least one source/drain includes a strained semiconductor-containing film situated in a trench in the variable thickness film;

wherein said at least one channel is located within a first thickness region of said variable thickness film having a first thickness between said substantially continuous planar top surface of said variable thickness film and a bottom surface of said at least one recess;

wherein said at least one source/drain is located within a second thickness region of said variable thickness film having a second thickness between a bottom surface of said at least one source/drain and a bottom surface of said variable thickness film, said first thickness region is thinner than said second thickness region.

2. The integrated circuit of claim 1 wherein:
the at least one channel is located over the at least one recess.

3. The integrated circuit of claim 1 further comprising:
an electronic system or a subsystem with the integrated circuit.

4. The integrated circuit of claim 1 wherein:
the at least one gate includes an NFET gate or a PFET gate;
the at least one channel includes an NFET channel or a PFET channel; and
the at least one source/drain includes an NFET source/drain or a PFET source/drain.

5. The integrated circuit of claim 1 wherein:
the at least one source/drain includes strained material.

6. The integrated circuit of claim 1 wherein:
the at least one source/drain includes strained silicon germanium or strained silicon carbide.

7. The integrated circuit of claim 1 wherein:
the integrated circuit includes a multi-electrode device.

8. The integrated circuit of claim 1 wherein:
the integrated circuit includes a multi-electrode device formed adjacent another multi-electrode device.

* * * * *